US011959946B2

(12) United States Patent
Bolouri-Saransar et al.

(10) Patent No.: US 11,959,946 B2
(45) Date of Patent: Apr. 16, 2024

(54) ABSENCE OF VOLTAGE DETECTION DEVICE FOR MEDIUM VOLTAGE APPLICATION

(71) Applicant: Panduit Corp., Tinley Park, IL (US)

(72) Inventors: Masud Bolouri-Saransar, Orland Park, IL (US); Walid Balid, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 359 days.

(21) Appl. No.: 17/517,134

(22) Filed: Nov. 2, 2021

(65) Prior Publication Data

US 2023/0003774 A1  Jan. 5, 2023

Related U.S. Application Data

(60) Provisional application No. 63/217,835, filed on Jul. 2, 2021.

(51) Int. Cl.
*G01R 19/155* (2006.01)
*H02M 3/07* (2006.01)
*H03H 7/01* (2006.01)

(52) U.S. Cl.
CPC ............ *G01R 19/155* (2013.01); *H02M 3/07* (2013.01); *H03H 7/0115* (2013.01)

(58) Field of Classification Search
CPC .... H03H 7/0115; G01R 19/155; G01R 31/00; H02M 3/07
See application file for complete search history.

(56) References Cited

U.S. PATENT DOCUMENTS

| | | | |
|---|---|---|---|
| 10,126,335 B2 | 11/2018 | Bolouri-Saransar et al. | |
| 2010/0033190 A1* | 2/2010 | Devine | G01R 19/145 324/537 |
| 2019/0391186 A1* | 12/2019 | Bollman | G01R 15/144 |
| 2020/0348343 A1 | 11/2020 | Balid et al. | |
| 2022/0236306 A1* | 7/2022 | Balid | G01R 19/155 |

* cited by examiner

*Primary Examiner* — Jermele M Hollington
*Assistant Examiner* — Taqi R Nasir
(74) *Attorney, Agent, or Firm* — Christopher S. Clancy; James H. Williams; Christopher K. Marlow

(57) ABSTRACT

A system for the verification of the absence of voltage has a first series of resistors and a first voltage limiter connected between a power line and a first voltage sensor and such as to limit a sensed voltage to a set amount above a threshold set by a standard and a first series of LC resonance filters connected between the power line and a RF signal generator. The system also has a second series of resistors and a second voltage limiter connected between the power line and a second voltage sensor and a second series of LC resonance filters connected between the power line and an RF signal detector. The system is configured to detect continuity to the voltage line by sending an RF signal generated by the RF signal generator through the first lead line and detecting it at the RF signal detector via the second lead line.

5 Claims, 11 Drawing Sheets

Absence of voltage sensing interface

Absence of voltage sensing interface

Connectivity detection interface

Absence of voltage detection and connectivity verification concept implementation HVCI Implementation Attaching HVCI to a MV Busbar FIG. 6 Using a single bi-channel HVCI Concept B block Diagram

ABSENCE OF VOLTAGE DETECTION DEVICE FOR MEDIUM VOLTAGE APPLICATION

CROSS REFERENCE TO RELATED APPLICATION(S)

This application claims benefit to U.S. Provisional Patent Application No. 63/217,835, filed on Jul. 2, 2021, the entirety of which is hereby incorporated by reference herein.

FIELD OF THE INVENTION

The following invention generally relates to systems for the verification of the absence of voltage and more specifically to a system for the verification of the absence of voltage in medium voltage applications.

BACKGROUND OF THE INVENTION

This application describes novel systems and methods to provide a reliable verification of Absence of Voltage and connectivity of a permanently installed absence of voltage tester (AVT) system that connects to a power line in an electrical equipment in a medium voltage application. The AVT indicates whether the equipment is in an electrically safe state or not without direct access to the equipment.

In order to meet the Safety Integrity Level III (SIL-III) rating, a set of independent and redundant sensing circuitries, as well as connectivity verification technique to the power line must be implemented.

In an electrical installation failure can be an undetached connection due to a faulty termination, thermal expansion, or vibration. Connectivity Verification can be accomplished by verifying that there is continuity throughout the system from the AVT to the main power lines. High isolation of the AVT equipment to the power lines needed to be accomplished. This forces any coupling to the mains to be high impedance in 10's of Mega ohm or 10's of Pico farad for a capacitive coupler.

SUMMARY OF THE INVENTION

In one embodiment, a system for the verification of the absence of voltage has a first series of resistors and a first voltage limiter connected between a power line and a first voltage sensor such as to limit a sensed voltage to a set amount above a threshold set by a standard along with a first series of LC resonance filters connected between the power line and a RF signal generator wherein the RF signal generator and the first voltage sensor share a lead line. The system also has a second series of resistors and a second voltage limiter connected between the power line and a second voltage sensor such as to limit the sensed voltage to a set amount above a threshold set by a standard and a second series of LC resonance filters connected between the power line and an RF signal detector wherein the RF signal detector and the second voltage sensor share a lead line. The system is configured to detect continuity to the voltage line by sending an RF signal generated by the RF signal generator through the first lead line and detecting it at the RF signal detector via the second lead line.

In another embodiment, a system for the verification of the absence of voltage has a first series of resistors and a first voltage limiter connected between a power line and a first voltage sensor such as to limit the voltage to a set amount above a threshold set by a standard and a second series of resistors and a second voltage limiter connected between the power line and a second voltage sensor such as to limit the voltage to a set amount above a threshold set by a standard. The system also has an RF charge pump connected to the power line via a series of LC resonance filters such as to apply a voltage to the voltage line that can be detected by the first and second voltage detectors

DETAILED DESCRIPTION OF THE INVENTION

Figure 1:
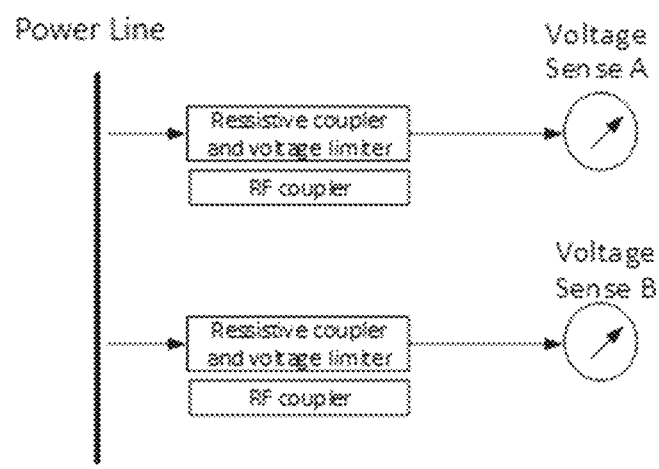
FIG. 1 shows a first embodiment of a system for the verification of the absence of voltage which illustrates a system block diagram to the two independent and redundant voltage detection channels combined with a RF coupler path from tester to the power mains.

FIG. 1 shows a first embodiment of a system for the verification of the absence of voltage which illustrates a system block diagram to the two independent and redundant voltage detection channels combined with a RF coupler path from tester to the power line. Activating the tester will ensure there is no voltage over threshold value on either of the sensing channels, then the tester will perform a connectivity test.

Figure 2:
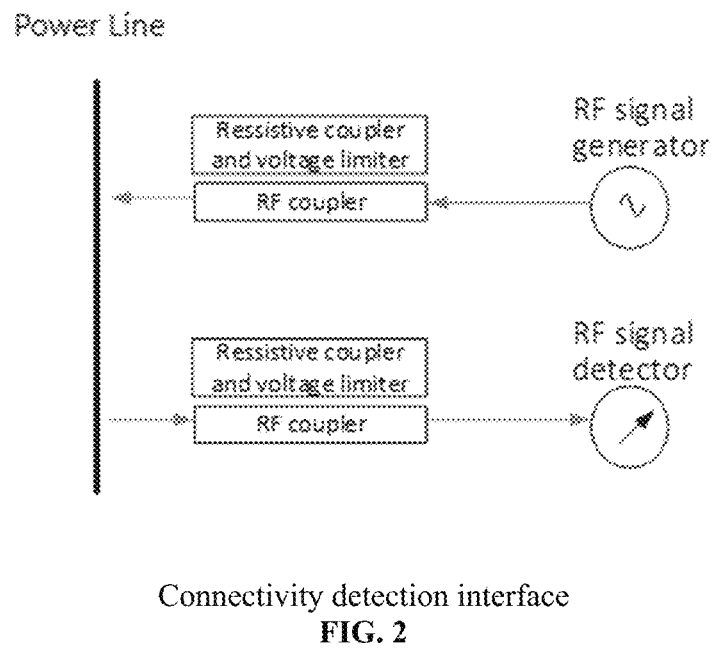
FIG. 2 illustrates the connectivity detection block diagram.

FIG. 2 illustrates the connectivity detection block diagram. The connectivity tester generates an RF signal that is connected to the grid though the transmitter RF coupler, which is embedded into a high voltage ceramic insulator (HVCI). The connectivity RF detector is connected to a separate RF coupler in a separate HVCI. This structure ensures that the link from HVCI-1 to HVCI-2 to the power line is valid. This circuitry/procedure is implemented and performed for each one of the three phases to verify the AVT connectivity to the power lines.

Figure 3:
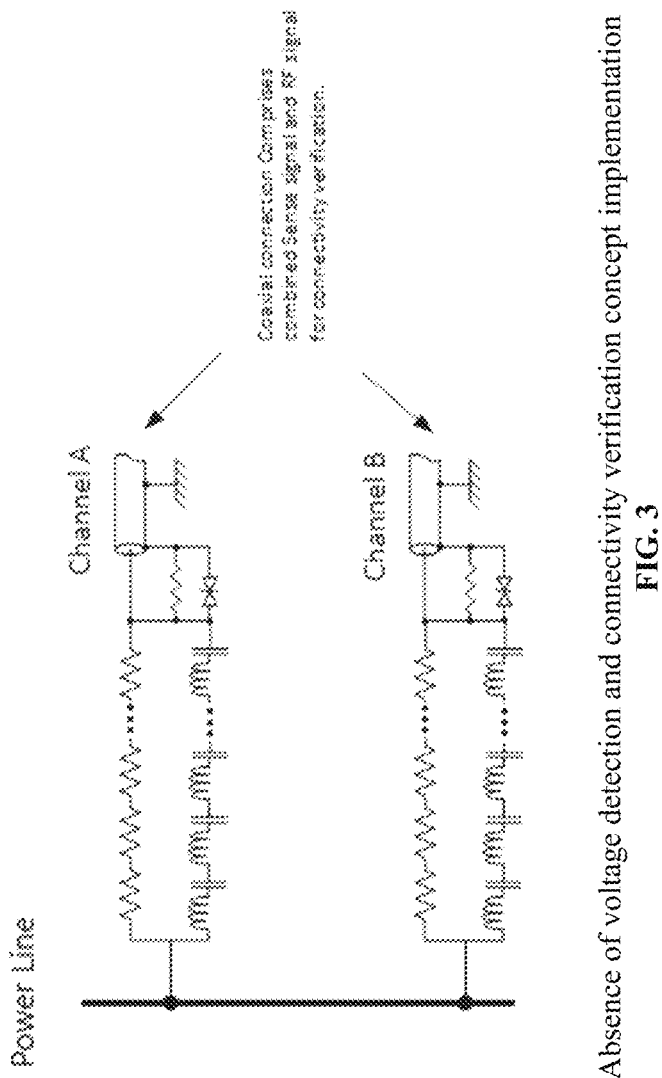
FIG. 3 illustrates an implementation of the concept.

FIG. 3 illustrates an implementation of the concept. A series of resistors are used between the power line and AVT for voltage sense. A voltage limiter is used on the secondary side (gigantic impedance side) to limit the voltage to 120% of the absence of voltage threshold defined by the standard.

The RF couplers are mainly isolated throughout a series of LC resonance filters. These filters are constructed from X1Y1 capacitors and high-frequency inductors in series, forming a resonance band-pass filter. Each of the X1Y1 capacitors can be rated at 760 VAC/1500 VDC and form capacitive coupling and reinforced isolation between primary (i.e., power lines) and secondary (i.e., connectivity detection) circuits.

Figure 4:
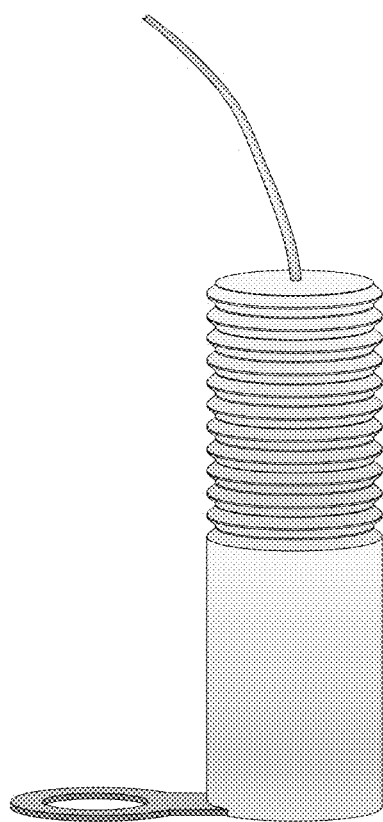
FIG. 4 illustrates a mechanical implementation using a HVCI that is potted with epoxy.
Figure 5:
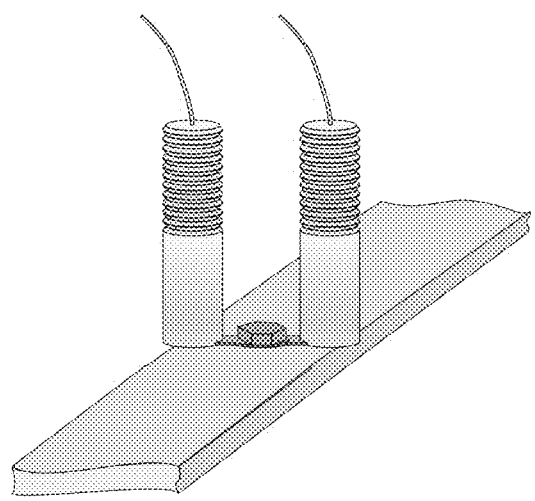
FIG. 5 illustrates an attachment method of the redundant HVCI to a Medium voltage busbar.
Figure 6:
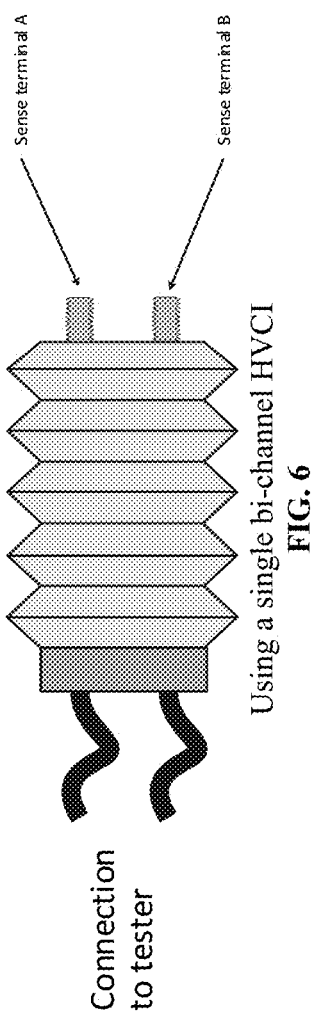
FIG. 6 illustrates integration of the two circuit in to one HVCI build.

FIG. 4 illustrates a mechanical implementation using a HVCI that is potted with epoxy. A Coaxial connection is used to connect the circuitry inside the HVCI to the main AVT system for absence of voltage detection and connectivity verification. Each phase will have two redundant channels. Each channel isolation interface (depicted in FIG. 3) will be embedded inside a HVCI. FIG. 5 illustrates an attachment method of the redundant HVCI to a medium voltage busbar. FIG. 6 illustrates integration of the two circuit in to one HVCI build.

Figure 7:
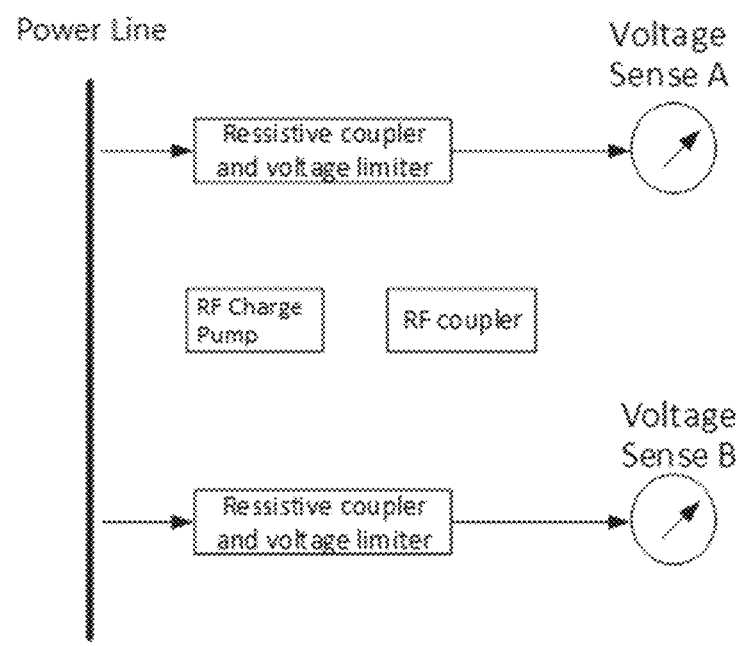
FIG. 7 shows a second embodiment of an absence of voltage system which illustrates a system block diagram for another novel concept for absence of voltage detection and connectivity verification.

FIG. 7 shows a second embodiment of an absence of voltage system which illustrates a system block diagram for another novel concept for absence of voltage detection and connectivity verification. Like the first embodiment, there are two independent/redundant channels for verifying absence of voltage. These channels are also used for verifying connectivity but with different concept.

The new concept utilizes an RF coupler and RF charge pump. Activating the tester will ensure there is voltage on either of the sensing channels, then the tester will perform a connectivity and "test the tester" assessment.

Figure 8:
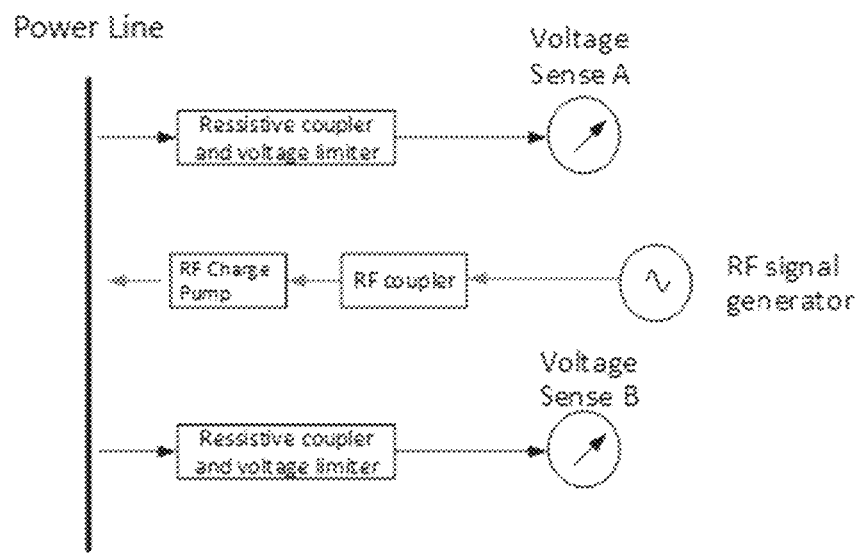
FIG. 8 shows the tester generating an RF signal that is connected to RF charge pump throughout series of LC resonance filters.

Depicted on FIG. 8, the tester generates an RF signal that is connected to RF charge pump throughout series of LC resonance filters. The charge pump connects to the power line. The RF signal will build up a relatively small voltage on the charge pump. The two absence of voltage channels will be used to detect the voltage produced by the charge pump. The outcome of the detection will not only be used for connectivity verification but also verifying the sensing circuits functionality. This procedure must be performed for all three phases.

Figure 9:
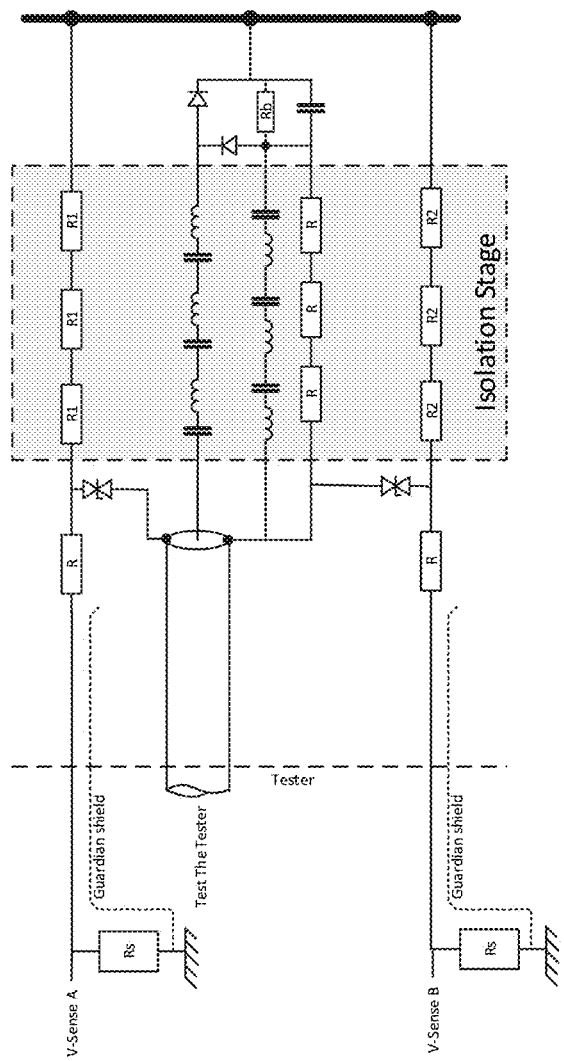
FIG. 9 illustrates an implementation of the concept.

FIG. 9 illustrates an implementation of the concept. Series of resistors is used between the power line and AVT for voltage sense. A voltage limiter is used on the secondary side (gigantic impedance side) to limit the voltage to 120% of the Absence of voltage threshold defined by the standard.

The RF couplers are mainly isolated throughout a series of LC resonance filters. These filters are constructed from X1Y1 capacitors and high-frequency inductors in series, forming a resonance band-pass filter. Each of the X1Y1 capacitors are rated at 760 VAC/1500 VDC and form capacitive coupling and reinforced isolation between primary (i.e., power lines) and secondary (i.e., connectivity detection) circuits. The charge pump functionality can be realized using two RF diodes, a capacitor and a discharge resistor. Series of resistor provides an offset/reference point to the charge pump.

Figure 10:
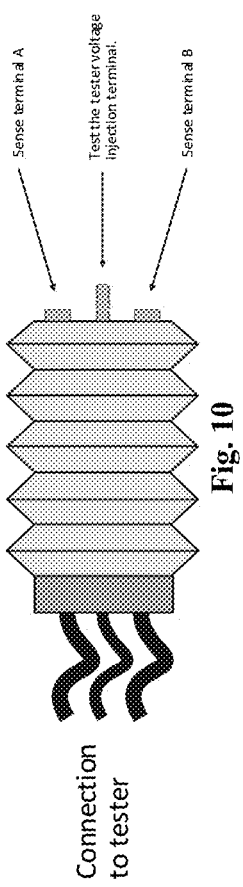
FIG. 10 illustrates a potential mechanical implementation of the two resistive couplers, RF coupler, and a charge pump into an HVCI. A Set of Coaxial connection links is used to connect the HVCI to the tester.
Figure 11:
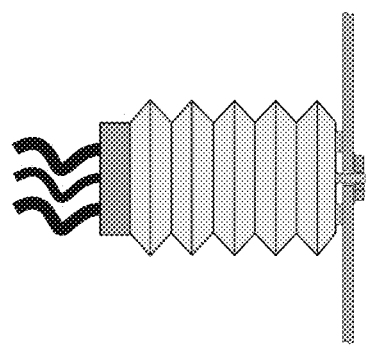
FIG. 11 illustrates a potential attachment of the HVCI to the Power lines.

FIG. 10 illustrates a potential mechanical implementation of the two resistive couplers, RF coupler, and a charge pump into an HVCI. A set of coaxial connection links is used to connect the HVCI to the tester. FIG. 11 illustrates a potential attachment of the HVCI to the power line.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

The invention claimed is:

1. A system for the verification of the absence of voltage comprising:
    a first series of resistors and a first voltage limiter connected between a power line and a first voltage sensor and a such as to limit a sensed voltage to a set amount above a threshold set by a standard;
    a first series of LC resonance filters connected between the power line and a RF signal generator wherein the RF signal generator and the first voltage sensor share a lead line;
    a second series of resistors and a second voltage limiter connected between the power line and a second voltage sensor such as to limit the sensed voltage to a set amount above a threshold set by a standard; and
    a second series of LC resonance filters connected between the power line and an RF signal detector wherein the RF signal detector and the second voltage sensor share a lead line and further wherein the system is configured to detect continuity to the voltage line by sending an RF signal generated by the RF signal generator through the first lead line and detecting it at the RF signal detector via the second lead line.

2. The system of claim 1 wherein the first series of LC resonance filters, the first series of resistors, and first voltage limiter are encapsulated in a first ceramic housing and the second series of LC resonance filters, the second series of resistors, and the second voltage limiter are encapsulated in a second ceramic housing.

3. The system of claim 1 wherein the first series of LC resonance filters, the first series of resistors, and the first voltage limiter along with the second series of LC resonance filters, the second series of resistors, and the second voltage limiter are encapsulated in a single ceramic housing.

4. A system for the verification of the absence of voltage comprising
    a first series of resistors and a first voltage limiter connected between a power line and a first voltage sensor such as to limit the voltage to a set amount above a threshold set by a standard;
    a second series of resistors and a second voltage limiter connected between the power line and a second voltage sensor such as to limit the voltage to a set amount above a threshold set by a standard; and
    an RF charge pump connected to the power line via a series of LC resonance filters such as to apply a voltage to the voltage line that can be detected by the first and second voltage detectors.

5. The system of claim 1 wherein the first series of resistors, the second series of resistors,
    and the series of LC resonance filters are encapsulated in a ceramic housing.

* * * * *